(12) United States Patent
Yang et al.

(10) Patent No.: US 10,790,223 B2
(45) Date of Patent: Sep. 29, 2020

(54) INTEGRATED CIRCUIT PACKAGE ELEMENT AND LOAD BOARD THEREOF

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Sheng-Fan Yang, Hsinchu (TW); Yuan-Hung Lin, Hsinchu (TW); Yu-Cheng Sun, Hsinchu (TW); Steve S. A. Wan, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 36 days.

(21) Appl. No.: 16/398,245

(22) Filed: Apr. 29, 2019

(65) Prior Publication Data
US 2020/0185313 A1    Jun. 11, 2020

(30) Foreign Application Priority Data
Dec. 11, 2018 (TW) .............................. 107144599 A

(51) Int. Cl.
| H01L 23/498 | (2006.01) |
| H01L 23/552 | (2006.01) |
| H01L 23/00 | (2006.01) |
| H01L 23/31 | (2006.01) |

(52) U.S. Cl.
CPC .. *H01L 23/49838* (2013.01); *H01L 23/49816* (2013.01); *H01L 23/49827* (2013.01); *H01L 23/552* (2013.01); *H01L 24/16* (2013.01); *H01L 23/3128* (2013.01); *H01L 2224/16235* (2013.01)

(58) Field of Classification Search
None
See application file for complete search history.

(56) References Cited

U.S. PATENT DOCUMENTS

| 9,647,762 | B2 * | 5/2017 | Arvelo | H01S 5/02476 |
| 9,666,544 | B2 * | 5/2017 | Zu | H01L 23/5386 |
| 10,091,873 | B1 * | 10/2018 | Xiong | H01L 23/49827 |
| 2004/0216071 | A1 * | 10/2004 | Miller | H05K 1/112 |
| | | | | 716/126 |

(Continued)

FOREIGN PATENT DOCUMENTS

TW        200525733 A      8/2005

*Primary Examiner* — Evren Seven
(74) *Attorney, Agent, or Firm* — CKC & Partners Co., LLC

(57) ABSTRACT

An integrated circuit package element provided includes a chip element and a package module coupled to the chip element. The chip element includes two driving units that are electrically connected to each other. The package module includes a grounding area, two individual power distributed networks and a grounded shielding structure which is completely disposed between the individual power distributed networks, electrically connected to the chip element, and configured to block power noise coupling between the first electric power distribution network and the second electric power distribution network. The grounding area is electrically connected to the individual electric power distribution networks and the grounded shielding structure.

10 Claims, 6 Drawing Sheets

(56) References Cited

U.S. PATENT DOCUMENTS

| | | | |
|---|---|---|---|
| 2009/0302414 A1* | 12/2009 | Ebefors | H01L 23/66 257/506 |
| 2014/0014404 A1* | 1/2014 | Hinton | H01L 23/49838 174/261 |
| 2016/0205770 A1* | 7/2016 | Popovic | H01L 23/50 361/748 |
| 2016/0254237 A1* | 9/2016 | Kim | H01L 23/5389 257/659 |
| 2019/0172826 A1* | 6/2019 | Or-Bach | H01L 27/0688 |
| 2020/0105650 A1* | 4/2020 | Rangaswamy | H05K 3/3436 |
| 2020/0235052 A1* | 7/2020 | Ramakrishnan | H01L 24/25 |

* cited by examiner

INTEGRATED CIRCUIT PACKAGE ELEMENT AND LOAD BOARD THEREOF

RELATED APPLICATIONS

This application claims priority to Taiwan Application Serial Number 107144599, filed Dec. 11, 2018, which is herein incorporated by reference.

BACKGROUND

Field of Disclosure

The present disclosure relates to an integrated circuit package element. More particularly, the present disclosure relates to an integrated circuit package element having a shielding ground, and a load board of the integrated circuit package element.

Description of Related Art

Flip-chip technology has been widely implemented in the chip-packaging field since flip-chip technology has advantages such as reductions of chip package area and signal transmission path. Generally, a die that is finished is mounted on a load board, and the load board with the die will be packaged into a semiconductor package element through an integrated circuit (IC) encapsulation method. After the semiconductor package element is installed on a circuit board, the die can exchange signals with the external through the circuit board.

However, since the modern size trends for the semiconductor packaging elements have been developed towards high density, electric power distribution networks (PDNs) are closely arranged in the semiconductor package element one to another, so that power noise coupling which introduces signal jitter due to the crosstalk effect is often caused, thereby decreasing the signal integrity of the semiconductor package element.

SUMMARY

In one embodiment of the disclosure, an integrated circuit package element is provided. The integrated circuit package element includes a chip element and a package module. The chip element includes a first driving unit and a second driving unit that is electrically connected to the first driving unit. The package module is coupled to the chip element, and the package module includes a first electric power distribution network, a second electric power distribution network, a grounded shielding structure and a grounding area. The first electric power distribution network is electrically connected to the first driving unit, and configured to transmit power supply to the first driving unit. The second electric power distribution network is electrically connected to the second driving unit, and configured to transmit power supply to the second driving unit. The grounded shielding structure is completely disposed between the first electric power distribution network and the second electric power distribution network, electrically connected to the chip element, and configured to block power noise coupling between the first electric power distribution network and the second electric power distribution network. The grounding area that is electrically connected to the first electric power distribution network, the second electric power distribution network and the grounded shielding structure.

In one embodiment of the disclosure, a load board for loading a chip element thereon is provided. The load board includes a plate body, a first electric power distribution network, a second electric power distribution network, a grounded shielding structure and a grounded area. The plate body has a first surface and a second surface which are opposite to each other. The first electric power distribution network penetrates through the plate body to respectively connect to the first surface and the second surface, and is configured to electrically connect to a driving unit of the chip element through the first surface. The second electric power distribution network penetrates through the plate body to respectively connect to the first surface and the second surface, and is configured to electrically connect to another driving unit of the chip element through the first surface. The grounded shielding structure penetrates through the plate body to respectively connect to the first surface and the second surface, is disposed between the first electric power distribution network and the second electric power distribution network, electrically connected to the chip element, and configured to block power noise coupling between the first electric power distribution network and the second electric power distribution network. The grounding area is located on the plate body, and electrically connected to the first electric power distribution network, the second electric power distribution network and the grounded shielding structure.

With the structure described in the above embodiments, power noise coupling between the first electric power distribution network and the second electric power distribution network can be reduced, thereby reducing signal jitter generated at an output end of the chip element and increasing the signal integrity of the semiconductor package element.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
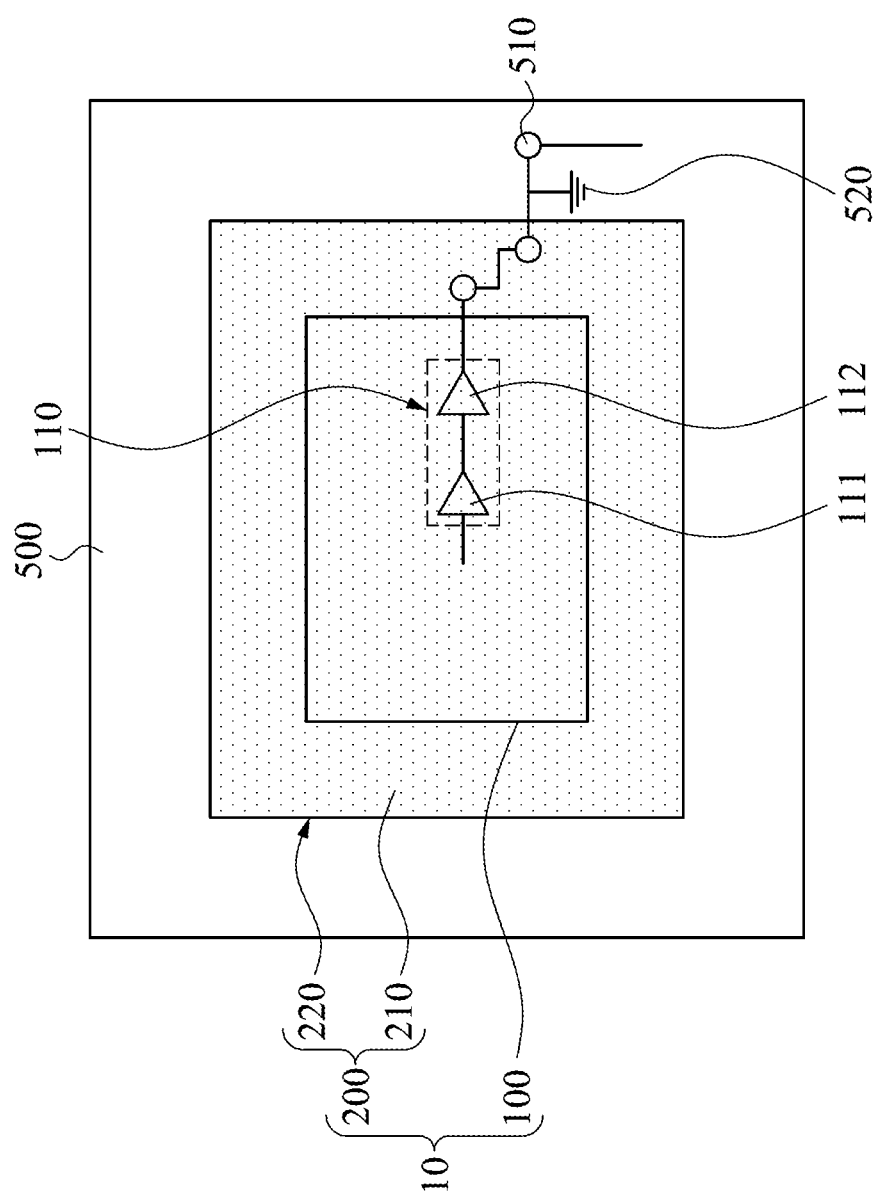
FIG. 1 is a schematic top view of an integrated circuit package element being disposed on a circuit board according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
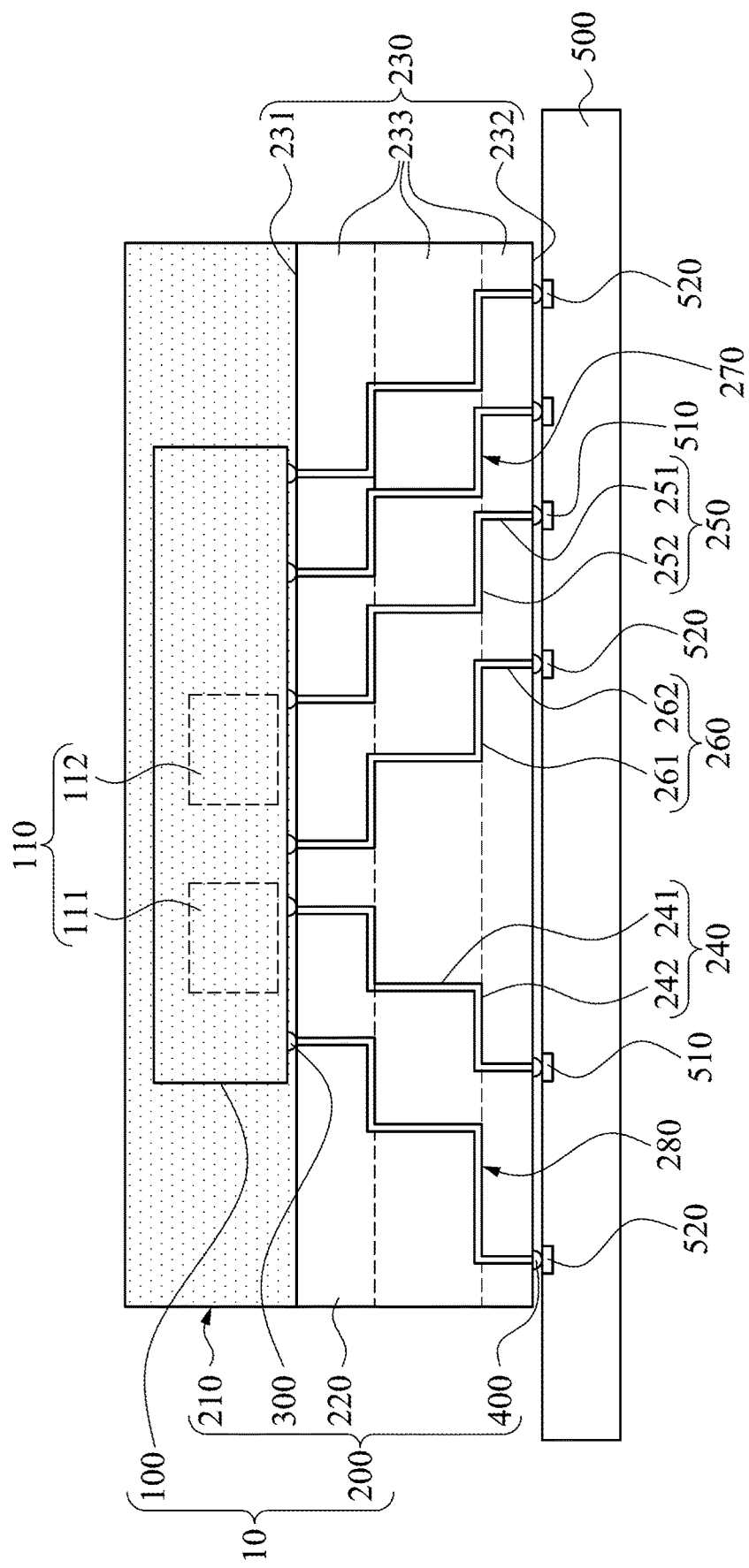
FIG. 2 is a cross-sectional view of an integrated circuit package element according to one embodiment of the disclosure.

Reference is now made to FIG. 1 and FIG. 2 in which FIG. 1 is a schematic top view of an integrated circuit package element 10 being disposed on a circuit board 500 according to one embodiment of the disclosure, and FIG. 2 is a cross-sectional view of an integrated circuit package element 10 according to one embodiment of the disclosure. As shown in FIG. 1 and FIG. 2, the integrated circuit (IC) package element 10 is used to be soldered on a circuit board 500 (for example, a rigid printed circuit board, a flexible printed circuit board, or other circuit-loading substrate). The integrated circuit package element 10 includes a chip element 100 and a package module 200. The chip element 100 includes a first driving unit 111 and a second driving unit 112 that is electrically connected to the first driving unit. The first driving unit 111 is provided with a first on-chip power network. The second driving unit 112 is provided with a second on-chip power network. The first on-chip power network and the second on-chip power network are operated independently to each other. The package module 200 is coupled to the chip element 100, so that the package module 200 and the chip element 100 are collectively formed into the integrated circuit package element 10. The package module 200 includes a first electric power distribution network (PDN) 240, a second electric power distribution network (PDN) 250, a grounded shielding structure 260, a signal-line distribution network 270 and a grounding area (e.g., refer to common ground 520). The first electric power distribution network 240 is electrically connected to the first driving unit 111 for transmitting power supply to the first driving unit 111. Exemplarily, the first electric power distribution network 240 provides power supply from the circuit board 500 to the first on-chip power network of the first driving unit 111. The second electric power distribution network 250 is electrically connected to the second driving unit 112 for transmitting power supply to the second driving unit 112. Exemplarily, the second electric power distribution network 250 provides power supply from the circuit board 500 to the second on-chip power network of the second driving unit 112. The first electric power distribution network 240 and the second electric power distribution network 250 are electrically isolated from each other. The signal-line distribution network 270 is electrically connected to the second driving unit 112 for transmitting signals processed by the second driving unit 112 outwards from the integrated circuit package element 10. Exemplarily, the signal-line distribution network 270 transmits the signals of the second driving unit 112 to the circuit board 500. The grounding area is electrically connected to the first electric power distribution network 240, the second electric power distribution network 250 and the grounded shielding structure 260. Exemplarily, the grounding area is in physical contact with a common ground 520 of the circuit board 500 so that the first electric power distribution network 240, the second electric power distribution network 250 and the grounded shielding structure 260 can collectively have the same ground terminal.

For example, in the embodiment, the chip element 100 is implemented on High-Speed Serial Link Technology, and the chip element 100 includes a serializer-deserializer (SerDes) 110 so that the first driving unit 111 can be a front-located driver (e.g., receiving end, RX) of the serializer-deserializer, the second driving unit can be a rear-located driver (e.g., transmitter, TX) of the serializer-deserializer. The rear-located driver is connected to the front-located driver. The front-located driver is used for processing internal signal therein, and the rear-located driver is used for sending the processed internal signals outwards from the chip element 100. The chip element 100 also includes channels (not shown).

In the embodiment, the first electric power distribution network 240 and the second electric power distribution network 250 are located in a common circuit block corresponding to the serializer-deserializer 110. Also, in the embodiment, each of the first electric power distribution network 240 and the second electric power distribution network 250 is a radio-frequency (RF) wiring structure or an analog wiring structure.

In order to reduce crosstalk effect of power noise coupling between the power networks, the present embodiment improves the isolation of the power supply parasitic inductance and the cross power domains, for example, the grounded shielding structure 260 is disposed between the first electric power distribution network 240 and the second electric power distribution network 250. Since the first electric power distribution network 240 and the second electric power distribution network 250 are relatively closely arranged with each other, thus, when power noise coupling between the first electric power distribution network 240 and the second electric power distribution network 250 can be reduced, because the grounded shielding structure 260 is disposed between the first electric power distribution network 240 and the second electric power distribution network 250, power noise coupling between the first electric power distribution network and the second electric power distribution network can be blocked as much as possible by the grounded shielding structure 260. Thereby reducing signal jitter generated at the signal-line distribution network 270 (i.e., the output end of the chip element) and increasing the noise isolation and the signal integrity of the integrated circuit package element 10.

Specifically, in the embodiment, the package module 200 further includes an encapsulation body 210, a load board 220, a plurality of first contacts 300 and a plurality of second contacts 400. The chip element 100 is mounted on the load board 220. The encapsulation body 210 encapsulates the chip element 100 and the load board 220 so as to fixedly integrate the chip element 100 and the load board 220 in the encapsulation body 210. The grounding area is disposed on the load board 220. The load board 220 includes a plate body 230 having a first surface 231 and a second surface 232 which are opposite to each other. The first contacts 300 are distributed on the first surface 231 of the plate body 230, and the first contacts 300 are bumps. The second contacts 400, for example, are ball pads. However, the disclosure is not limited to types of the integrated circuit package element 10.

The first electric power distribution network 240 penetrates through the plate body 230 to respectively connect to the first surface 231 and the second surface 232, and is electrically connected to the first driving unit 111 through the first surface 231, and electrically connected to the circuit board 500 through the second surface 232. Furthermore, the first electric power distribution network 240 is electrically connected to the first driving unit 111 through a part of the first contacts 300, electrically connected to power contacts 510 of the circuit board 500 through a part of the second contacts 400, and electrically connected to the common ground 520 of the circuit board 500 through the grounding area.

The second electric power distribution network 250 penetrates through the plate body 230 to respectively connect to the first surface 231 and the second surface 232, and is electrically connected to the second driving unit 112 through the first surface 231, and electrically connected to the circuit board 500 through the second surface 232. Furthermore, the second electric power distribution network 250 is electrically connected to the second driving unit 112 through another part of the first contacts 300, electrically connected to power contacts 510 of the circuit board 500 through another part of the second contacts 400, and electrically connected to the common ground 520 of the circuit board 500 through the grounding area. The grounded shielding structure 260 penetrates through the plate body 230 to respectively connect to the first surface 231 and the second surface 232, is disposed between the first electric power distribution network 240 and the second electric power distribution network 250, and electrically connected to the chip element 100 through the first surface 231. Furthermore, the grounded shielding structure 260 is electrically connected to the chip element 100 through one another part of the first contacts 300, and electrically connected to the common ground 520 of the circuit board 500 through the grounding area.

The signal-line distribution network 270 penetrates through the plate body 230 to respectively connect to the first surface 231 and the second surface 232, and is electrically connected to the second driving unit 112 through the first surface 231, and electrically connected to the circuit board 500 through the second surface 232 so as to transmit the signal processed by the second driving unit 112 to the circuit board 500. Furthermore, the signal-line distribution network 270 is electrically connected to the second driving unit 112 through one another part of the first contacts 300 and electrically connected to the circuit board 500 through one another part of the second contacts 400.

The package module 200 further includes other grounded shielding structure 280. The grounded shielding structure 280 not located between the first electric power distribution network 240 and the second electric power distribution network 250 is connected to the grounding area so as to be the ground of other electric power distribution networks.

In this embodiment, although the first electric power distribution network 240, the second electric power distribution network 250 and the grounded shielding structure 260 are collectively deployed on the load board 220 in the package module 200, however, the disclosure is not limited thereto, other than the load board 220, the first electric power distribution network 240, the second electric power distribution network 250 and the grounded shielding structure 260 may also be deployed in another component in the package module 200 in other embodiments.

Specifically, the load board 220 includes a plurality of layers 233 that are stacked one another. A vertical direction from the first surface 231 towards the second surface 232 is equal to a stacking direction that the layers 233 are stacked one another. The first electric power distribution network 240 penetrates through these layers 233. Exemplarily, the first electric power distribution network 240 is in a ladder shape, and the first electric power distribution network 240 includes a plurality of first penetrating conductive portions 241 and a plurality of first planar conductive portions 242. The first penetrating conductive portions 241 are parallel one another, and each of the first penetrating conductive portions 241 penetrates through one of the layers 233. Each of the first planar conductive portions 242 is interposed between any two neighboring layers 233, and is connected to any two neighboring ones of the first penetrating conductive portions 241. The first penetrating conductive portions 241, for example, are through silicon via (TSV), however, the disclosure is not limited thereto.

The second electric power distribution network 250 penetrates through these layers 233. Exemplarily, the second electric power distribution network 250 is in a ladder shape, and the second electric power distribution network 250 includes a plurality of second penetrating conductive portions 251 and a plurality of second planar conductive portions 252. The second penetrating conductive portions 251 are parallel one another, and each of the second penetrating conductive portions 251 penetrates through one of the layers 233. Each of the second planar conductive portions 252 is interposed between any two neighboring layers 233, and is connected to any two neighboring ones of the second penetrating conductive portions 251. The second penetrating conductive portions 251, for example, are through silicon via (TSV), however, the disclosure is not limited thereto.

The grounded shielding structure 260 penetrates through these layers 233. Exemplarily, the grounded shielding structure 260 is in a ladder shape, and the grounded shielding structure 260 includes a plurality of third penetrating conductive portions 261 and a plurality of third planar conductive portions 262. The third penetrating conductive portions 261 are parallel one another, and each of the third penetrating conductive portions 261 penetrates through one of the layers 233. Each of the third planar conductive portions 262 is interposed between any two neighboring layers 233, and is connected to any two neighboring ones of the third penetrating conductive portions 261. The third penetrating conductive portions 261, for example, are through silicon via (TSV), however, the disclosure is not limited thereto.

It is noted, each of the layers 233 commonly has one of the first penetrating conductive portions 241, one of the second penetrating conductive portions 251 and one of the third penetrating conductive portions 261 therein, and each of the third penetrating conductive portion 261 which is coplanar to one of the first penetrating conductive portions 241 and one of the third penetrating conductive portion 261 is disposed between the corresponding first penetrating conductive portions 241 and the corresponding second penetrating conductive portions 251 in the same layer 233 so that the grounded shielding structure 260 is completely disposed between the first electric power distribution network 240 and the second electric power distribution network 250.

Figure 3:
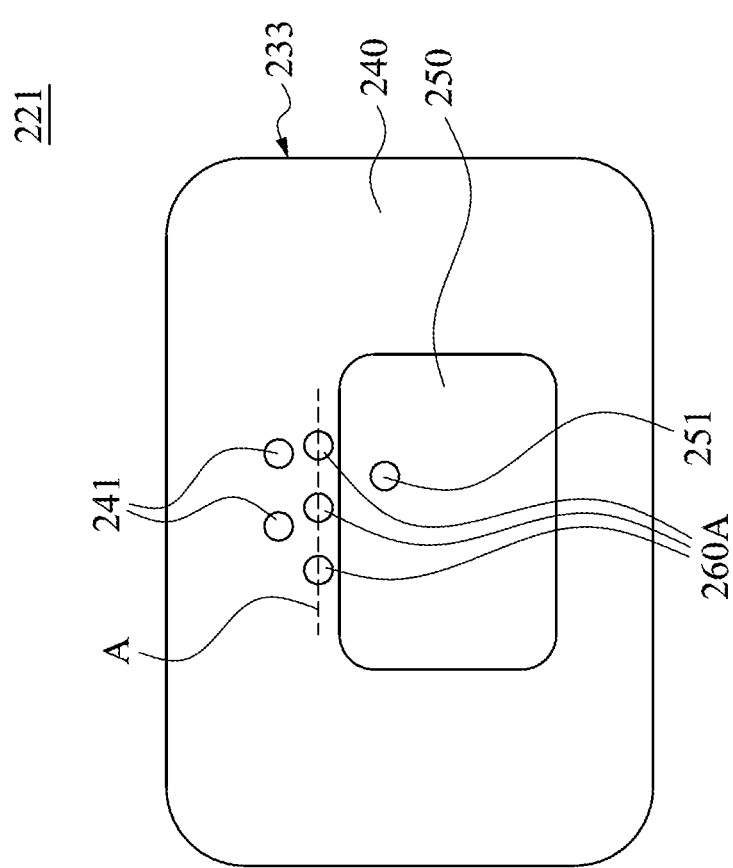
FIG. 3 is a schematic view of one of layers of a load board according to one embodiment of the disclosure.

FIG. 3 is a schematic view of one of layers 233 of a load board 221 according to one embodiment of the disclosure. The load board 221 of FIG. 3 is substantially the same to the load board 221 of FIG. 1, however, one of the differences between the load board 221 of FIG. 3 and the load board 221 of FIG. 1 is that, as shown in FIG. 2 and FIG. 3, the grounded shielding structures 260A can be plural in number such as two or three. These grounded shielding structures 260A are arranged in succession along a hypothetical line A. The hypothetical line A is located between two of the first penetrating conductive portions 241 and one of the second penetrating conductive portions 251 so that power noise coupling between each of the first penetrating conductive portions 241 and each of the second penetrating conductive portions can be blocked. For example, the first electric power distribution network 240 surrounds the second electric power distribution network 250, and the grounded shielding structures 260A are located between the second electric power distribution network 250 and a part of the first electric power distribution network 240.

Figure 4:
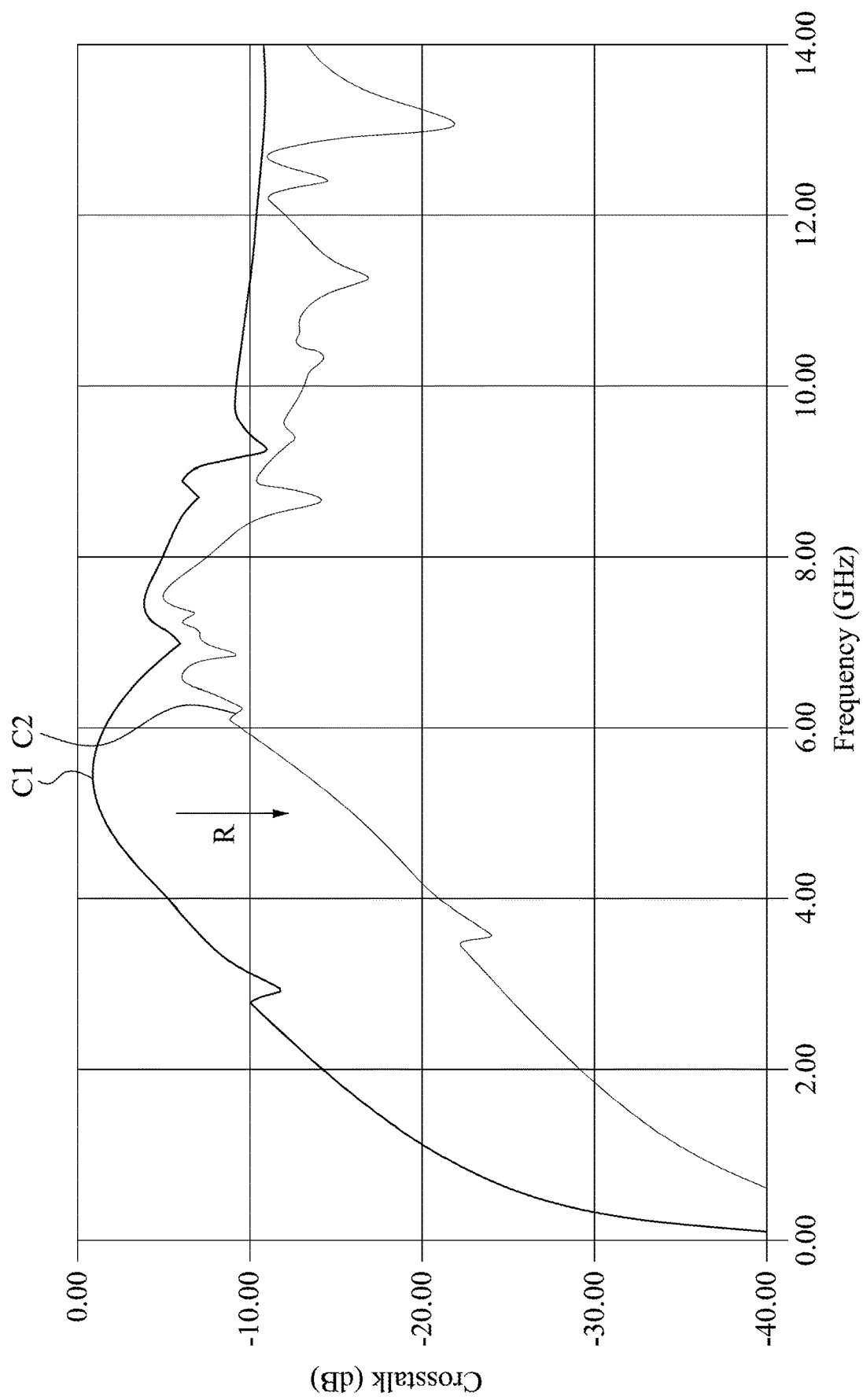
FIG. 4 is a diagram showing electromagnetic simulated results by comparing with a prior integrated circuit package before optimized and two prototypes of an integrated circuit package element according to one embodiment of the disclosure.

FIG. 4 is a diagram showing electromagnetic simulated results by comparing with a prior integrated circuit package before optimized (see curved line C1) and an integrated circuit package element 10 according to one embodiment of the disclosure (see curved line C2). In the embodiment, the integrated circuit package element 10 is a ball grid array package component, and the load board is provided with 10 layers stacked one another, and has a total thickness of 850 μm. As shown in FIG. 4, compared with the prior integrated circuit package before optimized, the integrated circuit package element 10 of the embodiment further has the capability of crosstalk suppression, especially, in the frequency band above 9 GHz, which is more superior to the prior integrated circuit package before optimization. Furthermore, compared with the curved line C1 and the curved line C2, as the electromagnetic simulated results are at 5.5 GHz (see the arrow R) in FIG. 4, the curved line C2 of the integrated circuit package element 10 of the embodiment is significantly reduced by 12 dB than the curved line C1, thus, it shows that the electromagnetic wave isolation is significantly improved. Therefore, the grounded shielding structure 260 being as an electromagnetic shield between the first electric power distribution network 240 and the second electric power distribution network 250 does have significant shielding effects.

Figure 5A:
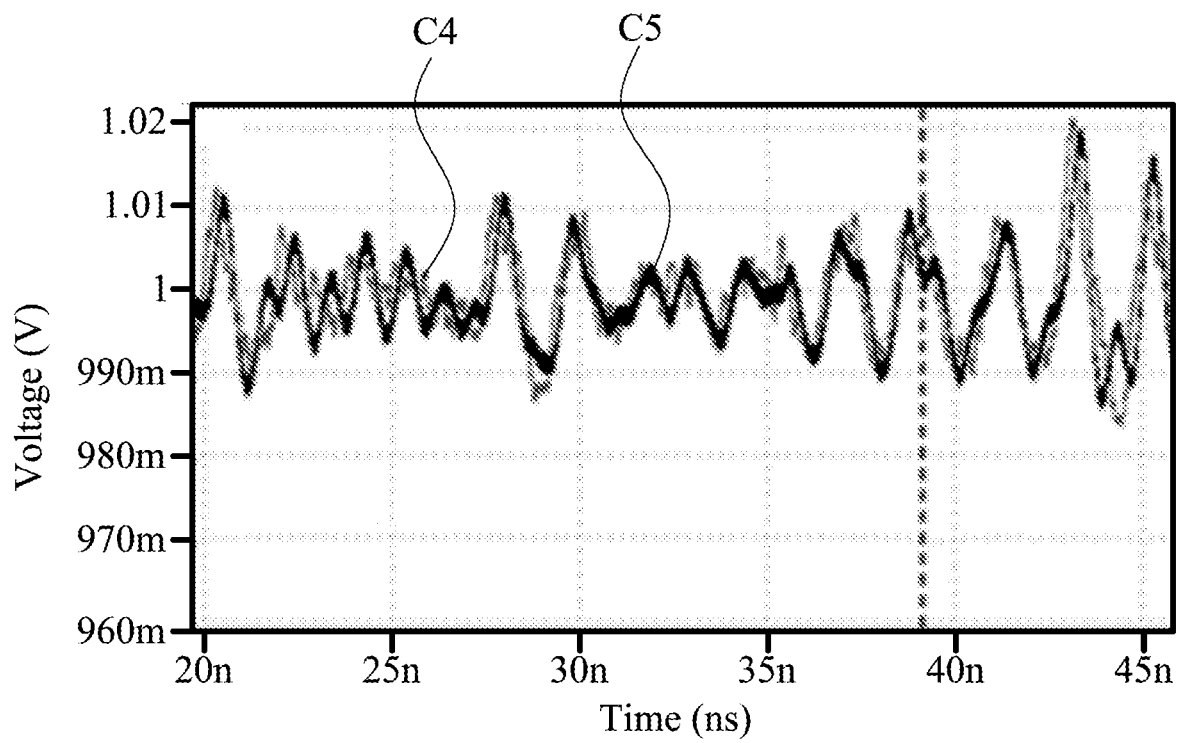
FIG. 5A is a power noise waveform diagram of a prior integrated circuit package before optimized.
Figure 5B:
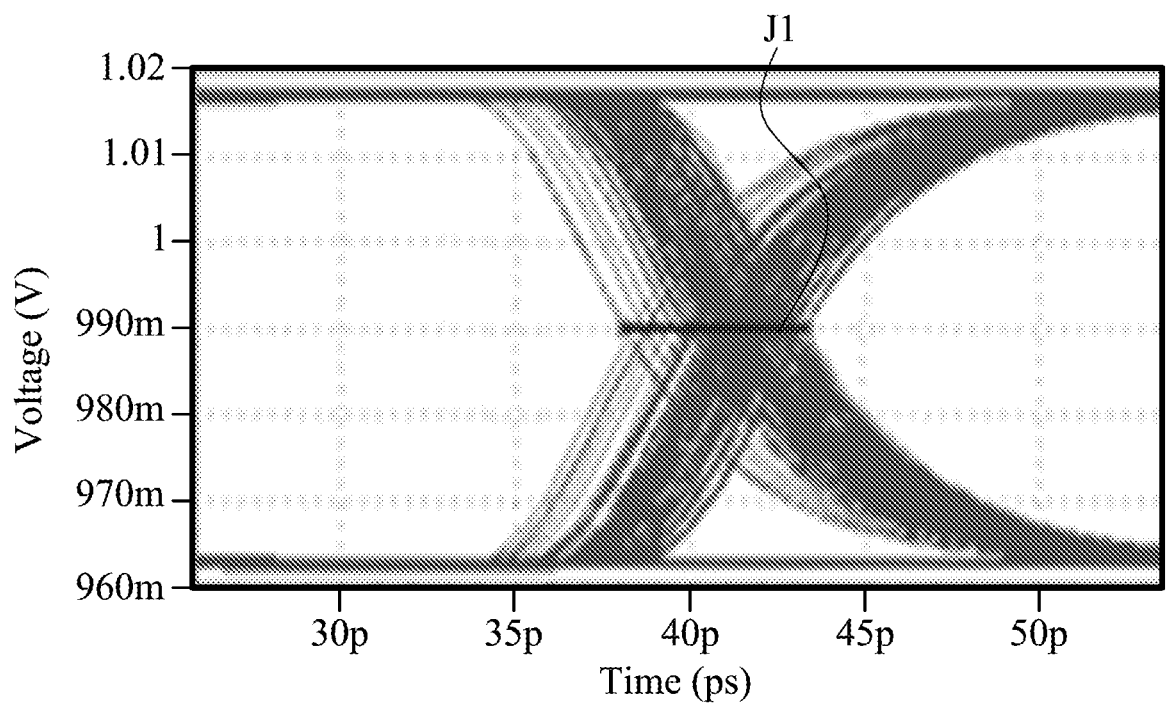
FIG. 5B is a simulated eye diagram of the prior integrated circuit package before optimized.
Figure 6A:
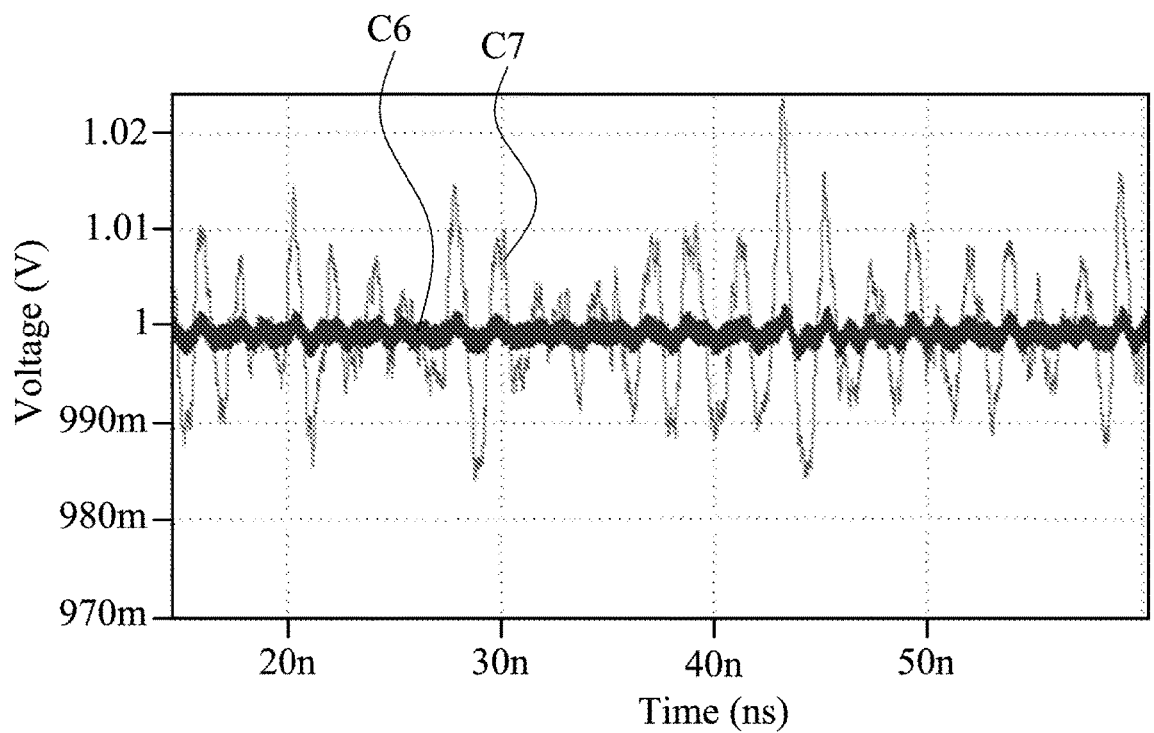
FIG. 6A is a power noise waveform diagram of an integrated circuit package element according to one embodiment of the disclosure.
Figure 6B:
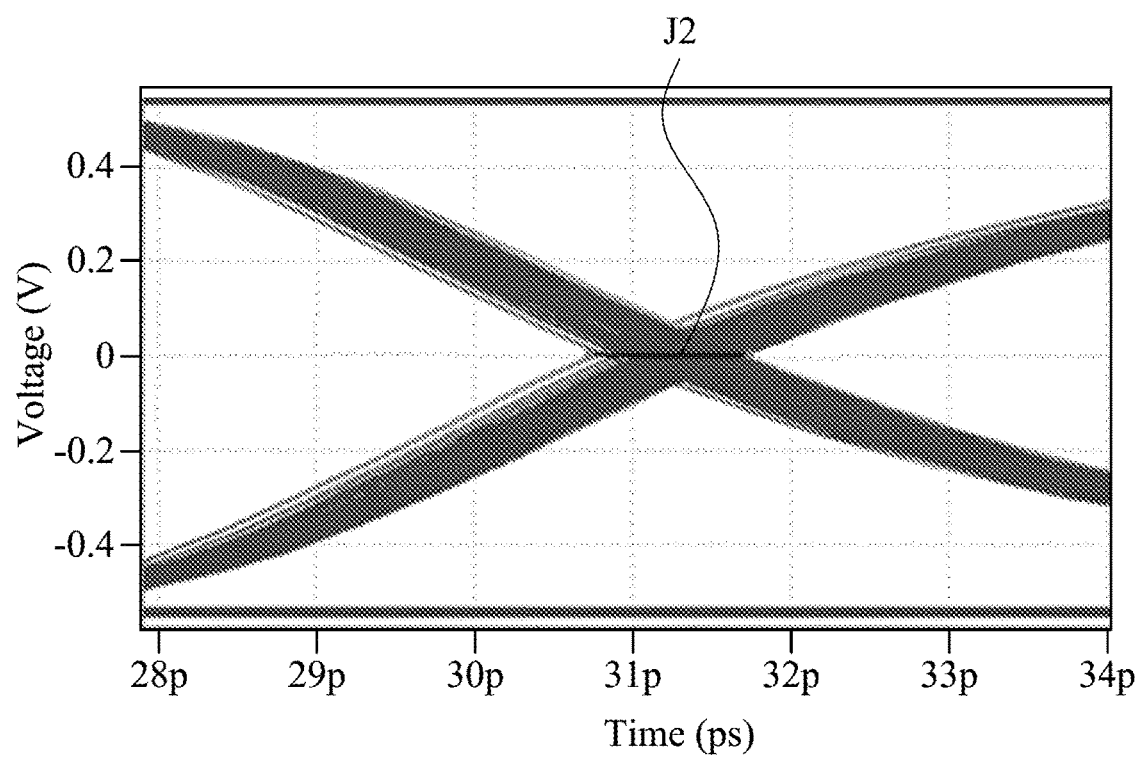
FIG. 6B is a simulated eye diagram of the integrated circuit package element according to one embodiment of the disclosure.

Reference is now made to FIG. 5A to FIG. 6B in which FIG. 5A is a power noise waveform diagram of a prior integrated circuit package before optimized, and FIG. 5B is a simulated eye diagram of the prior integrated circuit package before optimized. FIG. 6A is a power noise waveform diagram of an integrated circuit package element according to one embodiment of the disclosure, and FIG. 6B is a simulated eye diagram of the integrated circuit package element according to one embodiment of the disclosure. FIG. 5A and FIG. 6A are power noise waveform diagrams in which the unit of the X-axis is Nanosecond (ns) and the unit of the Y-axis is voltage (V). FIG. 5B and FIG. 6B are simulated eye diagrams in which the unit of the X-axis is Picosecond (ps) and the unit of the Y-axis is voltage (V).

As shown in FIGS. 5A and 5B, as the noise coupling ratio of two power distribution networks (see curved lines C4 and C5, FIG. 5A) of the prior integrated circuit package before optimized is 1:1, the jitter caused by the power supply noise (see line J1, FIG. 5B) is 5.25 per picosecond (ps). On the other hand, as shown in FIGS. 6A and 6B, when the noise coupling ratio of the first electric power distribution network and the second electric power distribution network (see curved lines C6 and C7, FIG. 6A) of the integrated circuit package element of the embodiment of the disclosure is reduced to 1:0.1, the jitter caused by the power supply noise (see line J2, FIG. 6B) is correspondingly reduced to 1.02 per picosecond (ps). Therefore, in the output diagram of 28 Gbps of a high speed serial link, the jitter caused by the power supply noise is reduced by 80%, and there is no cost increment in package manufacturing cost.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An integrated circuit package element, comprising:
   a chip element comprising a first driving unit and a second driving unit that is electrically connected to the first driving unit;
   a package module that is coupled to the chip element, comprising:
      a first electric power distribution network that is electrically connected to the first driving unit, and configured to transmit power supply to the first driving unit;
      a second electric power distribution network that is electrically connected to the second driving unit, and configured to transmit power supply to the second driving unit;
      a grounded shielding structure that is completely disposed between the first electric power distribution network and the second electric power distribution network, electrically connected to the chip element, and configured to block power noise coupling between the first electric power distribution network and the second electric power distribution network; and
      a grounding area that is electrically connected to the first electric power distribution network, the second electric power distribution network and the grounded shielding structure.

2. The integrated circuit package element of claim 1, wherein the package module further comprises:
   a load board;
   a plurality of first contacts that are distributed on one surface of the load board; and
   a plurality of second contacts that are distributed on the other surface of the load board,
   wherein the first electric power distribution network, the second electric power distribution network and the grounded shielding structure are respectively deployed in the load board, and
   each of the first electric power distribution network, the second electric power distribution network and the grounded shielding structure is electrically connected to the first contacts and the second contacts, respectively, and
   the first electric power distribution network and the second electric power distribution network respectively electrically connected to the first driving unit and the second driving unit through the first contacts, respectively.

3. The integrated circuit package element of claim 2, wherein the load board comprises a plurality of layers that are stacked one another, the first electric power distribution network comprises at least one first penetrating conductive portion, the second electric power distribution network comprises at least one second penetrating conductive portion, and the grounded shielding structure comprises at least one third penetrating conductive portion, wherein the first penetrating conductive portion, the second penetrating conductive portion and the third penetrating conductive portion are collectively disposed in a common one of the layers, and the third penetrating conductive portion is disposed between the first penetrating conductive portion and the second penetrating conductive portion.

4. The integrated circuit package element of claim 1, wherein the first electric power distribution network and the second electric power distribution network are independent to each other, and electrically isolated from each other.

5. The integrated circuit package element of claim 1, wherein each of the first electric power distribution network and the second electric power distribution network is a radio-frequency wiring structure or an analog wiring structure.

6. The integrated circuit package element of claim 1, wherein the chip element comprises a serializer-deserializer, the first driving unit is a front-located driver of the serializer-deserializer, the second driving unit is a rear-located driver of the serializer-deserializer, and the first electric power distribution network and the second electric power distribution network are located in a common circuit block corresponding to the serializer-deserializer.

7. The integrated circuit package element of claim 1, wherein the integrated circuit package element is a ball grid array package component.

8. A load board for loading a chip element thereon, comprising:
 a plate body having a first surface and a second surface which are opposite to each other;
 a first electric power distribution network penetrating through the plate body to respectively connect to the first surface and the second surface, and configured to electrically connect to a driving unit of the chip element through the first surface;
 a second electric power distribution network penetrating through the plate body to respectively connect to the first surface and the second surface, and configured to electrically connect to another driving unit of the chip element through the first surface;
 a grounded shielding structure penetrating through the plate body to respectively connect to the first surface and the second surface, disposed between the first electric power distribution network and the second electric power distribution network, electrically connected to the chip element, and configured to block power noise coupling between the first electric power distribution network and the second electric power distribution network; and
 a grounding area located on the plate body, and electrically connected to the first electric power distribution network, the second electric power distribution network and the grounded shielding structure.

9. The load board of claim 8, wherein the plate body further comprises a plurality of layers that are stacked one another, the first electric power distribution network comprises at least one first penetrating conductive portion, the second electric power distribution network comprises at least one second penetrating conductive portion, and the grounded shielding structure comprises at least one third penetrating conductive portion,
 wherein the first penetrating conductive portion, the second penetrating conductive portion and the third penetrating conductive portion are collectively disposed in a common one of the layers, and the third penetrating conductive portion is disposed between the first penetrating conductive portion and the second penetrating conductive portion.

10. The load board of claim 8, wherein the first electric power distribution network and the second electric power distribution network are independent to each other, and electrically isolated from each other.

* * * * *